(12) United States Patent
Den Boer et al.

(10) Patent No.: US 10,133,426 B2
(45) Date of Patent: Nov. 20, 2018

(54) DISPLAY WITH MICRO-LED FRONT LIGHT

(71) Applicant: X-Celeprint Limited, Cork (IE)

(72) Inventors: Willem Den Boer, Brighton, MI (US); Ronald S. Cok, Rochester, NY (US)

(73) Assignee: X-Celeprint Limited, Cork (IE)

( * ) Notice: Subject to any disclaimer, the term of this patent is extended or adjusted under 35 U.S.C. 154(b) by 218 days.

(21) Appl. No.: 14/849,242

(22) Filed: Sep. 9, 2015

(65) Prior Publication Data

US 2017/0068362 A1    Mar. 9, 2017

(51) Int. Cl.
| | |
|---|---|
| *G06F 3/041* | (2006.01) |
| *H01L 33/62* | (2010.01) |
| *G09G 3/32* | (2016.01) |
| *H01L 33/60* | (2010.01) |
| *G06F 3/044* | (2006.01) |
| *H01L 25/075* | (2006.01) |
| *H01L 25/16* | (2006.01) |

(Continued)

(52) U.S. Cl.
CPC .......... *G06F 3/044* (2013.01); *G02F 1/13338* (2013.01); *G02F 1/133603* (2013.01); *G06F 3/0412* (2013.01); *G06F 3/0416* (2013.01); *G09G 3/32* (2013.01); *H01L 25/0753* (2013.01); *H01L 25/167* (2013.01); *H01L 33/60* (2013.01); *H01L 33/62* (2013.01); *G02F 1/13318* (2013.01); *G02F 1/133553* (2013.01); *G02F 2001/133601* (2013.01); *G02F 2001/133616* (2013.01); *G02F 2201/50* (2013.01); *G02F 2203/02* (2013.01); *G06F 2203/04111* (2013.01); *G06F 2203/04112* (2013.01); *G09G 2300/0426* (2013.01); *G09G 2354/00* (2013.01)

(58) Field of Classification Search
CPC ....... G06F 3/044; G06F 3/0412; G06F 3/0416
See application file for complete search history.

(56) References Cited

U.S. PATENT DOCUMENTS

| 4,746,202 A | 5/1988 | Perilloux et al. |
| 5,060,027 A | 10/1991 | Hart et al. |
| (Continued) | | |

FOREIGN PATENT DOCUMENTS

| CN | 103677427 A | 3/2014 |
| EP | 1662301 A1 | 5/2006 |
| (Continued) | | |

OTHER PUBLICATIONS

U.S. Appl. No. 14/788,632, filed Jun. 30, 2015, X-Celeprint Limited.

(Continued)

*Primary Examiner* — Ariel Balaoing
(74) *Attorney, Agent, or Firm* — William R. Haulbrook; Michael D. Schmitt; Choate, Hall & Stewart LLP

(57) ABSTRACT

A reflective display includes an array of reflective pixels in or beneath a display viewing area for viewing electronically displayed information. A layer is located on or over the display viewing area through which the display viewing area is viewed and a plurality of micro-LEDs is located on the layer in the display viewing area and arranged to emit light toward the display viewing area. A plurality of conductors is located on the layer and the conductors are electrically connected to the micro-LEDs. A controller is connected to the conductors to control the micro-LEDs to emit light illuminating the display viewing area.

26 Claims, 12 Drawing Sheets

(51) Int. Cl.
*G02F 1/1333* (2006.01)
*G02F 1/133* (2006.01)
*G02F 1/1335* (2006.01)

(56) References Cited

U.S. PATENT DOCUMENTS

| | | | |
|---|---|---|---|
| 5,550,066 A | 8/1996 | Tang et al. |
| 5,621,555 A | 4/1997 | Park |
| 5,625,202 A | 4/1997 | Chai |
| 5,748,161 A | 5/1998 | Lebby et al. |
| 5,815,303 A | 9/1998 | Berlin |
| 5,994,722 A | 11/1999 | Averbeck et al. |
| 6,025,730 A | 2/2000 | Akram et al. |
| 6,084,579 A | 7/2000 | Hirano |
| 6,087,680 A | 7/2000 | Gramann et al. |
| 6,143,672 A | 11/2000 | Ngo et al. |
| 6,169,294 B1 | 1/2001 | Biing-Jye et al. |
| 6,184,477 B1 | 2/2001 | Tanahashi |
| 6,278,242 B1 | 8/2001 | Cok et al. |
| 6,288,824 B1 | 9/2001 | Kastalsky |
| 6,340,999 B1 | 1/2002 | Masuda et al. |
| 6,392,340 B2 | 5/2002 | Yoneda et al. |
| 6,403,985 B1 | 6/2002 | Fan et al. |
| 6,410,942 B1 | 6/2002 | Thibeault et al. |
| 6,466,281 B1 | 10/2002 | Huang et al. |
| 6,504,180 B1 | 1/2003 | Heremans et al. |
| 6,577,367 B2 | 6/2003 | Kim |
| 6,650,382 B1 | 11/2003 | Sumida et al. |
| 6,660,457 B1 | 12/2003 | Imai et al. |
| 6,703,780 B2 | 3/2004 | Shiang et al. |
| 6,717,560 B2 | 4/2004 | Cok et al. |
| 6,756,576 B1 | 6/2004 | McElroy et al. |
| 6,812,637 B2 | 11/2004 | Cok et al. |
| 6,828,724 B2 | 12/2004 | Burroughes |
| 6,933,532 B2 | 8/2005 | Arnold et al. |
| 6,969,624 B2 | 11/2005 | Iwafuchi et al. |
| 6,975,369 B1 | 12/2005 | Burkholder |
| 7,009,220 B2 | 3/2006 | Oohata |
| 7,012,382 B2 | 3/2006 | Cheang et al. |
| 7,091,523 B2 | 8/2006 | Cok et al. |
| 7,098,589 B2 | 8/2006 | Erchak et al. |
| 7,127,810 B2 | 10/2006 | Kasuga et al. |
| 7,129,457 B2 | 10/2006 | McElroy et al. |
| 7,195,733 B2 | 3/2007 | Rogers et al. |
| 7,259,391 B2 | 8/2007 | Liu et al. |
| 7,288,753 B2 | 10/2007 | Cok |
| 7,402,951 B2 | 7/2008 | Cok |
| 7,417,648 B2 | 8/2008 | Credelle |
| 7,420,221 B2 | 9/2008 | Nagai |
| 7,466,075 B2 | 12/2008 | Cok et al. |
| 7,521,292 B2 | 4/2009 | Rogers et al. |
| 7,557,367 B2 | 7/2009 | Rogers et al. |
| 7,586,497 B2 | 9/2009 | Boroson et al. |
| 7,605,053 B2 | 10/2009 | Couillard et al. |
| 7,614,757 B2 | 11/2009 | Nesterenko et al. |
| 7,622,367 B1 | 11/2009 | Nuzzo et al. |
| 7,629,955 B2 | 12/2009 | Asao et al. |
| 7,662,545 B2 | 2/2010 | Nuzzo et al. |
| 7,687,812 B2 | 3/2010 | Louwsma et al. |
| 7,704,684 B2 | 4/2010 | Rogers et al. |
| 7,791,271 B2 | 9/2010 | Cok et al. |
| 7,799,699 B2 | 9/2010 | Nuzzo et al. |
| 7,816,856 B2 | 10/2010 | Cok et al. |
| 7,834,541 B2 | 11/2010 | Cok |
| 7,872,722 B2 | 1/2011 | Kimura |
| 7,893,612 B2 | 2/2011 | Cok |
| 7,898,734 B2 | 3/2011 | Coleman et al. |
| 7,919,342 B2 | 4/2011 | Cok |
| 7,927,976 B2 | 4/2011 | Menard |
| 7,932,123 B2 | 4/2011 | Rogers et al. |
| 7,943,491 B2 | 5/2011 | Nuzzo et al. |
| 7,948,172 B2 | 5/2011 | Cok et al. |
| 7,969,085 B2 | 6/2011 | Cok |
| 7,972,875 B2 | 7/2011 | Rogers et al. |
| 7,982,296 B2 | 7/2011 | Nuzzo et al. |
| 7,990,058 B2 | 8/2011 | Cok et al. |
| 7,999,454 B2 | 8/2011 | Winters et al. |
| 8,004,758 B2 | 8/2011 | Coleman et al. |
| 8,029,139 B2 | 10/2011 | Ellinger et al. |
| 8,039,847 B2 | 10/2011 | Nuzzo et al. |
| 8,058,663 B2 | 11/2011 | Fan et al. |
| 8,198,621 B2 | 6/2012 | Rogers et al. |
| 8,207,547 B2 | 6/2012 | Lin |
| 8,243,027 B2 | 8/2012 | Hotelling et al. |
| 8,261,660 B2 | 9/2012 | Menard |
| 8,288,843 B2 | 10/2012 | Kojima et al. |
| 8,334,545 B2 | 12/2012 | Levermore et al. |
| 8,394,706 B2 | 3/2013 | Nuzzo et al. |
| 8,440,546 B2 | 5/2013 | Nuzzo et al. |
| 8,450,927 B2 | 5/2013 | Lenk et al. |
| 8,470,701 B2 | 6/2013 | Rogers et al. |
| 8,502,192 B2 | 8/2013 | Kwak et al. |
| 8,506,867 B2 | 8/2013 | Menard |
| 8,536,584 B2 | 9/2013 | Yao |
| 8,581,827 B2 | 11/2013 | Park et al. |
| 8,596,846 B2 | 12/2013 | Yankov et al. |
| 8,619,011 B2 | 12/2013 | Kimura |
| 8,664,699 B2 | 3/2014 | Nuzzo et al. |
| 8,686,447 B2 | 4/2014 | Tomoda et al. |
| 8,722,458 B2 | 5/2014 | Rogers et al. |
| 8,735,932 B2 | 5/2014 | Kim et al. |
| 8,754,396 B2 | 6/2014 | Rogers et al. |
| 8,766,970 B2 | 7/2014 | Chien et al. |
| 8,791,474 B1 | 7/2014 | Bibl et al. |
| 8,794,501 B2 | 8/2014 | Bibl et al. |
| 8,803,857 B2 | 8/2014 | Cok |
| 8,817,369 B2 | 8/2014 | Daiku |
| 8,836,624 B2 | 9/2014 | Roberts et al. |
| 8,854,294 B2 | 10/2014 | Sakariya |
| 8,860,051 B2 | 10/2014 | Fellows et al. |
| 8,877,648 B2 | 11/2014 | Bower et al. |
| 8,884,844 B2 | 11/2014 | Yang et al. |
| 8,889,485 B2 | 11/2014 | Bower |
| 8,895,406 B2 | 11/2014 | Rogers et al. |
| 8,902,152 B2 | 12/2014 | Bai et al. |
| 8,912,020 B2 | 12/2014 | Bedell et al. |
| 8,946,760 B2 | 2/2015 | Kim |
| 8,987,765 B2 | 3/2015 | Bibl et al. |
| 9,048,449 B2 | 6/2015 | Kim et al. |
| 9,105,813 B1 | 8/2015 | Chang |
| 9,153,171 B2 | 10/2015 | Sakariya et al. |
| 9,178,123 B2 | 11/2015 | Sakariya et al. |
| 9,202,996 B2 | 12/2015 | Orsley et al. |
| 9,277,618 B2 | 3/2016 | Odnoblyudov et al. |
| 9,308,649 B2 | 4/2016 | Golda et al. |
| 9,329,430 B2 | 5/2016 | Erinjippurath et al. |
| 9,343,042 B2 | 5/2016 | Miller et al. |
| 9,368,683 B1 | 6/2016 | Meitl et al. |
| 9,412,977 B2 | 8/2016 | Rohatgi |
| 9,437,782 B2 | 9/2016 | Bower et al. |
| 9,444,015 B2 | 9/2016 | Bower et al. |
| 9,520,537 B2 | 12/2016 | Bower et al. |
| 9,537,069 B1 | 1/2017 | Bower et al. |
| 9,626,908 B2 | 4/2017 | Sakariya et al. |
| 9,698,308 B2 | 7/2017 | Bower et al. |
| 9,705,042 B2 | 7/2017 | Bower et al. |
| 9,716,082 B2 | 7/2017 | Bower et al. |
| 2001/0022564 A1 | 9/2001 | Youngquist et al. |
| 2002/0096994 A1 | 7/2002 | Iwafuchi et al. |
| 2004/0080483 A1 | 4/2004 | Chosa |
| 2004/0180476 A1 | 9/2004 | Kazlas et al. |
| 2004/0212296 A1 | 10/2004 | Nakamura et al. |
| 2004/0227704 A1 | 11/2004 | Wang et al. |
| 2004/0252933 A1 | 12/2004 | Sylvester et al. |
| 2005/0006657 A1 | 1/2005 | Terashita |
| 2005/0012076 A1 | 1/2005 | Morioka |
| 2005/0116621 A1 | 6/2005 | Bellmann et al. |
| 2005/0140275 A1 | 6/2005 | Park |
| 2005/0168987 A1 | 8/2005 | Tamaoki et al. |
| 2005/0202595 A1 | 9/2005 | Yonehara et al. |
| 2005/0264472 A1 | 12/2005 | Rast |
| 2005/0275615 A1 | 12/2005 | Kahen et al. |
| 2005/0285246 A1 | 12/2005 | Haba et al. |
| 2006/0051900 A1 | 3/2006 | Shizuno |

(56) References Cited

U.S. PATENT DOCUMENTS

| | | |
|---|---|---|
| 2006/0063309 A1 | 3/2006 | Sugiyama et al. |
| 2006/0273862 A1 | 12/2006 | Shimmura |
| 2006/0289972 A1 | 12/2006 | Nishimura et al. |
| 2007/0035340 A1 | 2/2007 | Kimura |
| 2007/0077349 A1 | 4/2007 | Newman et al. |
| 2007/0182809 A1 | 8/2007 | Yarid et al. |
| 2007/0201056 A1 | 8/2007 | Cok et al. |
| 2008/0108171 A1 | 5/2008 | Rogers et al. |
| 2008/0211734 A1 | 9/2008 | Huitema et al. |
| 2009/0045420 A1 | 2/2009 | Eng et al. |
| 2009/0146921 A1 | 6/2009 | Takahashi |
| 2009/0278142 A1 | 11/2009 | Watanabe et al. |
| 2009/0295706 A1 | 12/2009 | Feng |
| 2009/0315054 A1 | 12/2009 | Kim et al. |
| 2010/0060553 A1 | 3/2010 | Zimmerman et al. |
| 2010/0078670 A1 | 4/2010 | Kim et al. |
| 2010/0123134 A1 | 5/2010 | Nagata |
| 2010/0123268 A1 | 5/2010 | Menard |
| 2010/0148198 A1 | 6/2010 | Sugizaki et al. |
| 2010/0149117 A1 | 6/2010 | Chien et al. |
| 2010/0186883 A1 | 7/2010 | Tomoda |
| 2010/0190293 A1 | 7/2010 | Maeda et al. |
| 2010/0201253 A1 | 8/2010 | Cok et al. |
| 2010/0207852 A1 | 8/2010 | Cok |
| 2010/0214245 A1 | 8/2010 | Hirota |
| 2010/0214247 A1 | 8/2010 | Tang et al. |
| 2010/0248484 A1 | 9/2010 | Bower et al. |
| 2010/0258710 A1 | 10/2010 | Wiese et al. |
| 2010/0270912 A1* | 10/2010 | Ko ................... H01L 27/3211 313/504 |
| 2010/0289115 A1 | 11/2010 | Akiyama et al. |
| 2010/0317132 A1 | 12/2010 | Rogers et al. |
| 2010/0321414 A1 | 12/2010 | Muroi et al. |
| 2010/0328268 A1 | 12/2010 | Teranishi et al. |
| 2011/0043435 A1 | 2/2011 | Hebenstreit et al. |
| 2011/0069013 A1 | 3/2011 | Rabenstein et al. |
| 2011/0108800 A1 | 5/2011 | Pan |
| 2011/0120678 A1 | 5/2011 | Palm |
| 2011/0205448 A1 | 8/2011 | Takata |
| 2011/0211348 A1 | 9/2011 | Kim |
| 2011/0242027 A1* | 10/2011 | Chang ................. G06F 3/0412 345/173 |
| 2012/0056835 A1* | 3/2012 | Choo ................... G06F 3/0412 345/173 |
| 2012/0105518 A1 | 5/2012 | Kang et al. |
| 2012/0119249 A1 | 5/2012 | Kim et al. |
| 2012/0126229 A1 | 5/2012 | Bower |
| 2012/0141799 A1 | 6/2012 | Kub et al. |
| 2012/0206428 A1 | 8/2012 | Cok |
| 2012/0206499 A1 | 8/2012 | Cok |
| 2012/0223636 A1 | 9/2012 | Shin et al. |
| 2012/0223875 A1 | 9/2012 | Lau et al. |
| 2012/0228669 A1 | 9/2012 | Bower et al. |
| 2012/0236022 A1 | 9/2012 | Homma et al. |
| 2012/0256163 A1 | 10/2012 | Yoon et al. |
| 2012/0274669 A1 | 11/2012 | Neal |
| 2012/0281028 A1 | 11/2012 | Orlick et al. |
| 2012/0314388 A1 | 12/2012 | Bower et al. |
| 2012/0320566 A1 | 12/2012 | Namekata |
| 2013/0006524 A1 | 1/2013 | Sasaki et al. |
| 2013/0010405 A1 | 1/2013 | Rothkopf et al. |
| 2013/0015483 A1 | 1/2013 | Shimokawa et al. |
| 2013/0016494 A1* | 1/2013 | Speier ................. H01L 25/0753 362/84 |
| 2013/0036928 A1 | 2/2013 | Rogers et al. |
| 2013/0069275 A1 | 3/2013 | Menard et al. |
| 2013/0088416 A1 | 4/2013 | Smith et al. |
| 2013/0196474 A1 | 8/2013 | Meitl et al. |
| 2013/0207964 A1 | 8/2013 | Fleck et al. |
| 2013/0221355 A1 | 8/2013 | Bower et al. |
| 2013/0248889 A1 | 9/2013 | Lin |
| 2013/0257264 A1 | 10/2013 | Tamaki et al. |
| 2013/0273695 A1 | 10/2013 | Menard et al. |
| 2013/0278513 A1 | 10/2013 | Jang |
| 2014/0014960 A1 | 1/2014 | Yamazaki et al. |
| 2014/0082934 A1 | 3/2014 | Cok |
| 2014/0084482 A1 | 3/2014 | Hu et al. |
| 2014/0085214 A1 | 3/2014 | Cok |
| 2014/0104157 A1 | 4/2014 | Burns et al. |
| 2014/0104243 A1 | 4/2014 | Sakariya et al. |
| 2014/0111442 A1 | 4/2014 | Cok et al. |
| 2014/0146273 A1 | 5/2014 | Kim et al. |
| 2014/0159043 A1 | 6/2014 | Sakariya et al. |
| 2014/0175498 A1 | 6/2014 | Lai |
| 2014/0183446 A1 | 7/2014 | Nago et al. |
| 2014/0198373 A1* | 7/2014 | Ray ..................... G02B 26/007 359/291 |
| 2014/0217448 A1 | 8/2014 | Kim et al. |
| 2014/0231839 A1 | 8/2014 | Jeon et al. |
| 2014/0231851 A1 | 8/2014 | Tsai et al. |
| 2014/0240617 A1 | 8/2014 | Fukutome et al. |
| 2014/0264763 A1 | 9/2014 | Meitl et al. |
| 2014/0267683 A1 | 9/2014 | Bibl et al. |
| 2014/0306248 A1 | 10/2014 | Ahn et al. |
| 2014/0339495 A1 | 11/2014 | Bibl et al. |
| 2014/0340900 A1 | 11/2014 | Bathurst et al. |
| 2014/0367633 A1 | 12/2014 | Bibl et al. |
| 2014/0367705 A1 | 12/2014 | Bibl et al. |
| 2015/0003040 A1 | 1/2015 | Bessho et al. |
| 2015/0021632 A1 | 1/2015 | Taghizadeh et al. |
| 2015/0135525 A1 | 5/2015 | Bower |
| 2015/0137153 A1 | 5/2015 | Bibl et al. |
| 2015/0169011 A1 | 6/2015 | Bibl et al. |
| 2015/0179453 A1 | 6/2015 | Cheng et al. |
| 2015/0263066 A1 | 9/2015 | Hu et al. |
| 2015/0280066 A1 | 10/2015 | Fujimura et al. |
| 2015/0280089 A1 | 10/2015 | Obata et al. |
| 2015/0296580 A1 | 10/2015 | Kim et al. |
| 2015/0308634 A1 | 10/2015 | van de Ven et al. |
| 2015/0327388 A1 | 11/2015 | Menard et al. |
| 2015/0362165 A1 | 12/2015 | Chu et al. |
| 2015/0370130 A1 | 12/2015 | Lin |
| 2015/0371585 A1 | 12/2015 | Bower et al. |
| 2015/0371974 A1 | 12/2015 | Bower et al. |
| 2015/0372051 A1 | 12/2015 | Bower et al. |
| 2015/0372052 A1 | 12/2015 | Bower et al. |
| 2015/0372053 A1 | 12/2015 | Bower et al. |
| 2015/0372187 A1 | 12/2015 | Bower et al. |
| 2015/0373793 A1 | 12/2015 | Bower et al. |
| 2016/0004123 A1 | 1/2016 | Tanabe |
| 2016/0005721 A1 | 1/2016 | Bower et al. |
| 2016/0018094 A1 | 1/2016 | Bower et al. |
| 2016/0064363 A1 | 3/2016 | Bower et al. |
| 2016/0085120 A1 | 3/2016 | Xu |
| 2016/0093600 A1 | 3/2016 | Bower et al. |
| 2016/0131329 A1 | 5/2016 | Park et al. |
| 2016/0260388 A1* | 9/2016 | Yata ..................... G09G 3/3406 |
| 2016/0266697 A1 | 9/2016 | Cheng et al. |
| 2016/0343772 A1 | 11/2016 | Bower et al. |
| 2016/0351539 A1 | 12/2016 | Bower et al. |
| 2016/0364030 A1 | 12/2016 | Peana et al. |
| 2017/0005244 A1 | 1/2017 | Bower et al. |
| 2017/0025075 A1 | 1/2017 | Cok et al. |
| 2017/0025484 A1 | 1/2017 | Forrest et al. |
| 2017/0047393 A1 | 2/2017 | Bower et al. |
| 2017/0048976 A1 | 2/2017 | Prevatte et al. |
| 2017/0061842 A1 | 3/2017 | Cok et al. |
| 2017/0092863 A1 | 3/2017 | Bower et al. |
| 2017/0102797 A1 | 4/2017 | Cok |
| 2017/0122502 A1 | 5/2017 | Cok et al. |
| 2017/0133818 A1 | 5/2017 | Cok |
| 2017/0167703 A1 | 6/2017 | Cok |
| 2017/0186740 A1 | 6/2017 | Cok et al. |
| 2017/0187976 A1 | 6/2017 | Cok |
| 2017/0206845 A1 | 7/2017 | Sakariya et al. |
| 2017/0250219 A1 | 8/2017 | Bower et al. |
| 2017/0256521 A1 | 9/2017 | Cok et al. |
| 2017/0256522 A1 | 9/2017 | Cok et al. |
| 2017/0287882 A1 | 10/2017 | Cok et al. |

FOREIGN PATENT DOCUMENTS

| | | |
|---|---|---|
| EP | 2078978 A2 | 7/2009 |
| EP | 2148264 A2 | 1/2010 |

(56) References Cited

FOREIGN PATENT DOCUMENTS

| | | |
|---|---|---|
| EP | 2 610 314 A1 | 7/2013 |
| EP | 2703969 A2 | 3/2014 |
| GB | 2 496 183 A | 5/2013 |
| JP | 11-142878 | 5/1999 |
| WO | WO-2006/027730 A1 | 3/2006 |
| WO | WO-2006/099741 A1 | 9/2006 |
| WO | WO-2008/103931 A2 | 8/2008 |
| WO | WO-2010/032603 A1 | 3/2010 |
| WO | WO-2010/111601 A2 | 9/2010 |
| WO | WO-2010/132552 A1 | 11/2010 |
| WO | WO-2013/064800 A1 | 5/2013 |
| WO | WO-2013/165124 A1 | 11/2013 |
| WO | WO-2014/121635 A1 | 8/2014 |
| WO | WO-2014/149864 A1 | 9/2014 |
| WO | WO-2015/088629 A1 | 6/2015 |
| WO | WO-2015/193434 A2 | 12/2015 |
| WO | WO-2016/030422 A1 | 3/2016 |
| WO | WO-2016/046283 A2 | 3/2016 |
| WO | WO-2017/042252 A1 | 3/2017 |
| WO | WO-2017/060487 A2 | 4/2017 |
| WO | WO-2017/149067 A1 | 9/2017 |

OTHER PUBLICATIONS

U.S. Appl. No. 14/807,311, filed Jul. 23, 2015, X-Celeprint Limited.
U.S. Appl. No. 14/822,866, filed Aug. 10, 2015, Bower et al.
Choi, H. W. et al., Efficient GaN-based Micro-LED Arrays, Mat. Res. Soc. Symp. Proc. 743:L6.28.1-L6.28.6 (2003).
Cok, R. S. et al., AMOLED displays with transfer-printed integrated circuits, Journal of SID 19/(4):335-341 (2011).
Hamer et al., "63.2: AMOLED Displays Using Transfer-Printed Integrated Circuits," SID 09 Digest, 40(2):947-950 (2009).
Johnson, K. et al., Advances in Red VCSEL Technology, Advances in Optical Technologies, 2012:569379, 13 pages (2012).
Kasahara, D. et al, Nichia reports first room-temperature blue/'green' VCSELs with current injection, Appl. Phys. Express, 4(7):3 pages (2011).
Lee, S. H. etal, Laser Lift-Offof GaN Thin Film and its Application to the Flexible Light Emitting Diodes, Proc. of SPIE 8460:846011-1-846011-6 (2012).
Poher, V. et al., Micro-LED arrays: a tool for two-dimensional neuron stimulation, J. Phys. D: Appl. Phys. 41:094014 (2008).
Seurin, J.F. et al, High-power red VCSEL arrays, Proc. of SPIE 8639:1-9 (2013).
Yoon, J. et al., Heterogeneously Integrated Optoelectronic Devices Enabled by MicroTransfer Printing, Adv. Optical Mater. 3:1313-1335 (2015).
Koma, N. et al., 44.2: Novel Front-light System Using Fine-pitch Patterned OLED, SID, 08:655-658 (2008).
International Search Report, PCT/EP2016/071145, 5 pages, dated Dec. 15, 2017.
Written Opinion, PCT/EP2016/071145, 10 pages, dated Dec. 15, 2016.
Roscher, H., VCSEL Arrays with Redundant Pixel Designs for 10Gbits/s 2-D Space-Parallel MMF Transmission, Annual Report, optoelectronics Department, (2005).
Yaniv et al., A 640×480 Pixel Computer Display Using Pin Diodes with Device Redundancy, 1988 International Display Research Conference, IEEE, CH-2678-1/88:152-154 (1988).
Matioli, E. et al., High-brightness polarized light-emitting diodes, Light: Science & Applications, 1:e22:1-7 (2012).

\* cited by examiner

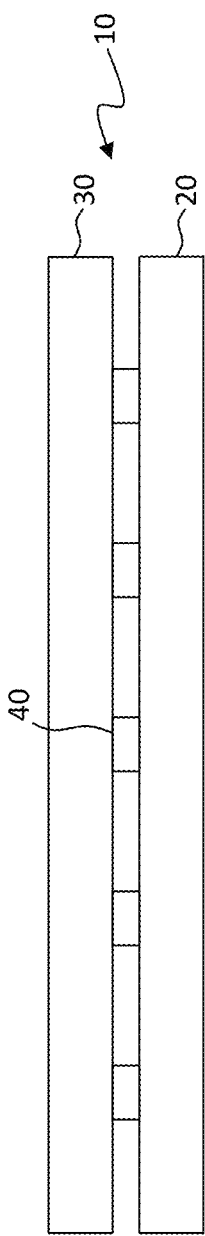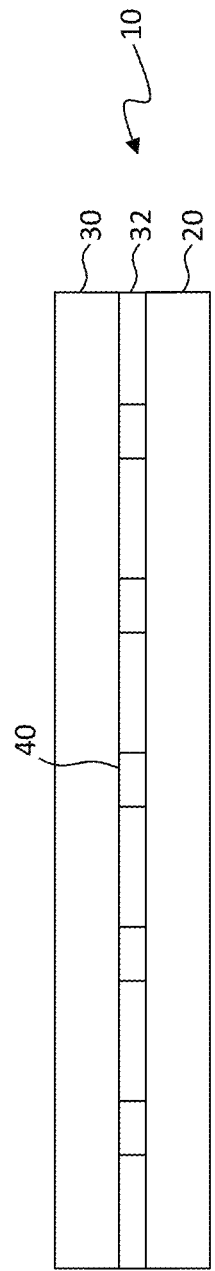

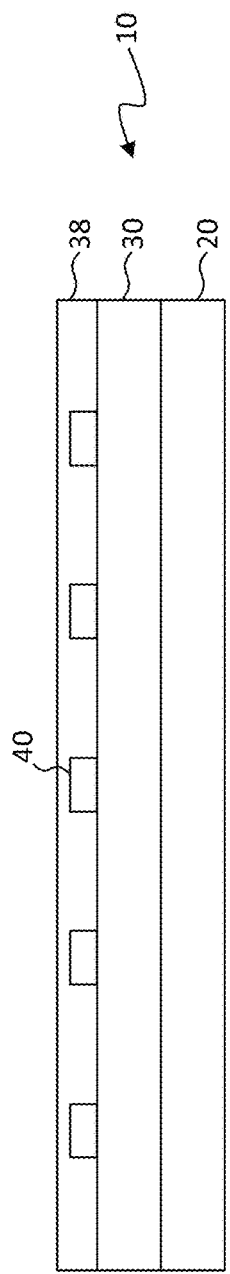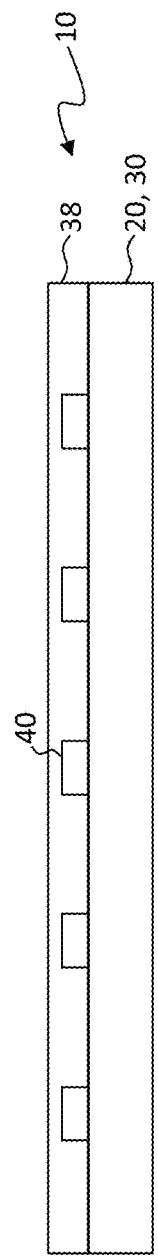

DISPLAY WITH MICRO-LED FRONT LIGHT

CROSS REFERENCE TO RELATED APPLICATIONS

Reference is made to commonly assigned U.S. patent application Ser. No. 14/754,573 filed Jun. 29, 2015, entitled Small-Aperture-Ratio Display with Electrical Component, to commonly assigned U.S. patent application Ser. No. 14/795,831 filed Jul. 9, 2015, entitled Active-Matrix Touchscreen, to commonly assigned U.S. patent application Ser. No. 14/822,868 filed Aug. 10, 2015, entitled Compound Micro-Assembly Strategies and Devices, and to commonly assigned U.S. patent application Ser. No. 14/743,788, filed Jun. 18, 2015 and titled Micro Assembled LED Displays and Lighting Elements, the contents of each of which are incorporated by reference herein in their entirety.

FIELD OF THE INVENTION

The present invention relates to front light illumination for reflective displays and, in certain embodiments, an integrated touch screen.

BACKGROUND OF THE INVENTION

Flat-panel displays are widely used in conjunction with computing devices, in portable devices, and for entertainment devices such as televisions. Such displays typically employ a plurality of pixels distributed over a display substrate to display images, graphics, or text. Both light-reflective and light-emissive displays are known. Light-emissive displays emit light and can be used in a dark ambient surround. In contrast, reflective displays cannot typically be viewed without incident ambient light. A variety of reflective displays are known, including reflective liquid crystal displays and electrophoretic displays, and are generally found in low-power applications such as e-readers.

In some reflective displays, a front light is integrated around the edge of the reflective display to illuminate the display so that it can be read in an otherwise dark environment. For example, U.S. Pat. Nos. 6,340,999 and 6,650,382 disclose an LCD with a front light having light sources around the edge of the display and a light guide for directing the edge lighting toward the display. U.S. Patent Application Publication No. 2004/0080483 describes a touch-panel integrated reflection-type LCD with a front light also having light sources around the edge of the display and a light guide for directing the edge lighting toward the display. U.S. Pat. No. 8,596,846 discloses an LCD with a holographic front light guide illuminated with lasers. These front-light structures require wave guides to provide uniform illumination over the display viewing surface, adding cost and thickness to the device, and are not readily integrated with touch screens. Moreover, edge illumination inhibits local dimming for rectangular areas within a subset of a display.

There remains a need, therefore, for alternative front-light structures that reduce layers in the display and are readily integrated with touch screens.

SUMMARY OF THE INVENTION

The present invention includes a reflective display and a front light for illuminating a display area of the reflective display, for example in a dark environment. The front light includes a plurality of micro-light-emitting diodes (micro-LEDs) in the display area on or in a layer between the reflective display and a viewer. The micro-LEDs are electrically connected to conductors in or on the layer driven by a controller to control the micro-LEDs to emit light and illuminate the display area.

In a further embodiment of the present invention, a touch screen such as a capacitive touch screen is integrated with the front light so that no additional layers are incorporated into the reflective display. In various embodiments, the touch screen is operated independently of the front light or in coordination with the front light.

Prior-art front lights are typically provided with light emitters located around the periphery of a display area and a light-guide plate that uniformly distributes light emitted from the edge light emitters over the display area. Light guide plates are expensive optical sheets that absorb some light and add undesirable thickness and weight to the device. In contrast, the present invention provides a front light for reflective displays without requiring a light-guide plate or edge emitters and can be integrated with touch screens so that little (e.g., less than 20 µm) or no additional thickness or light absorption is added to the reflective display structure. These advantages reduce costs and improve performance of the system.

In one aspect, the disclosed technology includes a reflective display, including: an array of reflective pixels in or beneath a reflective display viewing area for viewing electronically displayed information; a layer (e.g., transparent layer) located on or over the reflective display viewing area, the layer including: a plurality of micro-LEDs positioned in or on the layer within the x-y boundaries of the reflective display viewing area (e.g., distributed over the reflective display viewing area), and oriented to emit light toward the reflective display viewing area; and a plurality of conductors positioned on or in the layer and electrically connected to the micro-LEDs; and a controller connected to the conductors to control the micro-LEDs to emit light illuminating the reflective display viewing area (e.g., when ambient light is insufficient for viewing the electronically displayed information).

In certain embodiments, the layer is a display cover or substrate.

In certain embodiments, the micro-LEDs have an emitting face and are positioned on or in the layer such that there is a gap between the emitting face of the micro-LEDs and the surface of the reflective display viewing area.

In certain embodiments, the gap is a thickness of the layer.

In certain embodiments, the micro-LEDs are positioned on the layer.

In certain embodiments, the micro-LEDs are inorganic micro-LEDs.

In certain embodiments, the display includes a gap between the layer and a surface of the reflective display viewing area.

In certain embodiments, the display includes an optically clear adhesive adhering the layer to a surface of the reflective display viewing area.

In certain embodiments, one or more of the micro-LEDs emits white light.

In certain embodiments, the plurality of micro-LEDs includes red micro-LEDs that emit red light, green micro-LEDs that emit green light, and blue micro-LEDs that emit blue light.

In certain embodiments, the red micro-LEDs are located adjacent to green micro-LEDs, adjacent to blue micro-LEDs, or adjacent to both green and blue micro-LEDs.

In certain embodiments, the plurality of micro-LEDs is disposed in rows comprising red, green, and blue micro- LEDs and the micro-LEDs in adjacent rows are spatially offset or the colors of micro-LEDs in adjacent rows are spatially offset.

In certain embodiments, the plurality of micro-LEDs is disposed in groups each having one red, one green, and one blue micro-LED and wherein the distance between the micro-LEDs within a group is less than the distance between the groups of micro-LEDs.

In certain embodiments, the layer has a first side adjacent to the reflective display viewing area and a second side opposite the first side, and the reflective display includes a touch sensor having a pattern of electrodes formed on the first side, on the second side, or on both the first and the second sides.

In certain embodiments, the controller comprises a control circuit that provides electrical power to the conductors to emit light from the micro-LEDs and separately provides signals to the electrodes to detect touches on or near the layer or the reflective display.

In certain embodiments, the electrode pattern comprises an array of electrodes electrically separate from the conductors, wherein the conductors and the micro-LEDs are disposed between the electrodes.

In certain embodiments, the electrode pattern on the first side forms an array of electrically separate first electrodes extending in a first direction and the electrode pattern on the second side forms an array of electrically separate second electrodes extending in a second direction different from the first direction.

In certain embodiments, the controller comprises a control circuit that provides electrical power to the conductors to emit light from the micro-LEDs during a first time period and provides signals to the electrodes to detect touches during a second time period different from the first time period.

In certain embodiments, the electrodes are the conductors.

In certain embodiments, the electrodes are formed in an array of parallel electrodes and the micro-LEDs are connected to pairs of adjacent electrodes.

In certain embodiments, the electrode pattern forms an array of electrically separate first electrodes extending in a first direction and an array of electrically separate second electrodes extending in a second direction different from the first direction, and each micro-LED is connected to a first electrode and a second electrode.

In certain embodiments, the display includes a display controller that controls images displayed on the reflective display, wherein the controller comprises a control circuit that controls the micro-LEDs responsive to the images displayed on the reflective display to provide front light dimming.

In certain embodiments, the controller comprises a control circuit that controls the micro-LEDs in response to ambient illumination.

In certain embodiments, the display includes a protective layer coated over the micro-LEDs and the layer.

In certain embodiments, each micro-LED has an area or a light-emissive area of less than 500, 250, 100, or 50 square microns.

In certain embodiments, the micro-LEDs are spaced apart in one or two dimensions by 50 microns or more, 100 microns or more, 500 microns or more, 1 mm or more, 2 mm or more, or 5 mm or more.

In certain embodiments, the display includes an array of touch controller chiplets distributed over the display area each electrically connected to one or more electrically separate electrodes to detect touches on or adjacent to the one or more electrodes (e.g., on a display screen of the reflective display).

In certain embodiments, a conductor passes through the touch controller chiplet. In certain embodiments, the array of touch controller chiplets comprises 10,000 or more touch controller chiplets, 50,000 or more touch controller chiplets, 100,000 or more touch controller chiplets, 500,000 or more touch controller chiplets, or 1,000,000 or more touch controller chiplets.

In certain embodiments, touch controller chiplets are interspersed between the micro-LEDs.

In certain embodiments, touch controller chiplets are electrically connected to the micro-LEDs.

In certain embodiments, each of the micro-LEDs has a width from 2 to 5 μm, 5 to 10 μm, 10 to 20 μm, or 20 to 50 μm.

In certain embodiments, each of the micro-LEDs has a length from 2 to 5 μm, 5 to 10 μm, 10 to 20 μm, or 20 to 50 μm.

In certain embodiments, each of the micro-LEDs has with a height from 2 to 5 μm, 4 to 10 μm, 10 to 20 μm, or 20 to 50 μm.

In certain embodiments, the area of the micro-LEDs is less than or equal to one-quarter, one eighth, one tenth, one twentieth, one fiftieth, one hundredth, one five-hundredth, one thousandth, one two-thousandth, or one ten-thousandth of the reflective display viewing area.

In certain embodiments, the layer comprises the controller.

In certain embodiments, the controller is on or in the layer.

In another aspect, the disclosed technology includes a method of operating a reflective display structure, including: providing the reflective display structure as described herein, wherein the reflective display comprises an array of electrodes electrically separate from the conductors; controlling, by the controller, the micro-LEDs to emit light and controlling the array of electrodes to detect a touch.

In certain embodiments, the controller controls the micro-LEDs to emit light at the same time as a touch is detected.

In certain embodiments, the controller controls the micro-LEDs to emit light during a first time period and detects a touch with the array of electrodes during a second time period different from the first time period.

Embodiments of the present invention provide a thin, single-substrate, integrated front light and touchscreen system with improved performance and reduced size, weight, and thickness.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIGS. 3-7 are cross sections of various embodiments of the present invention;

Figure 1:
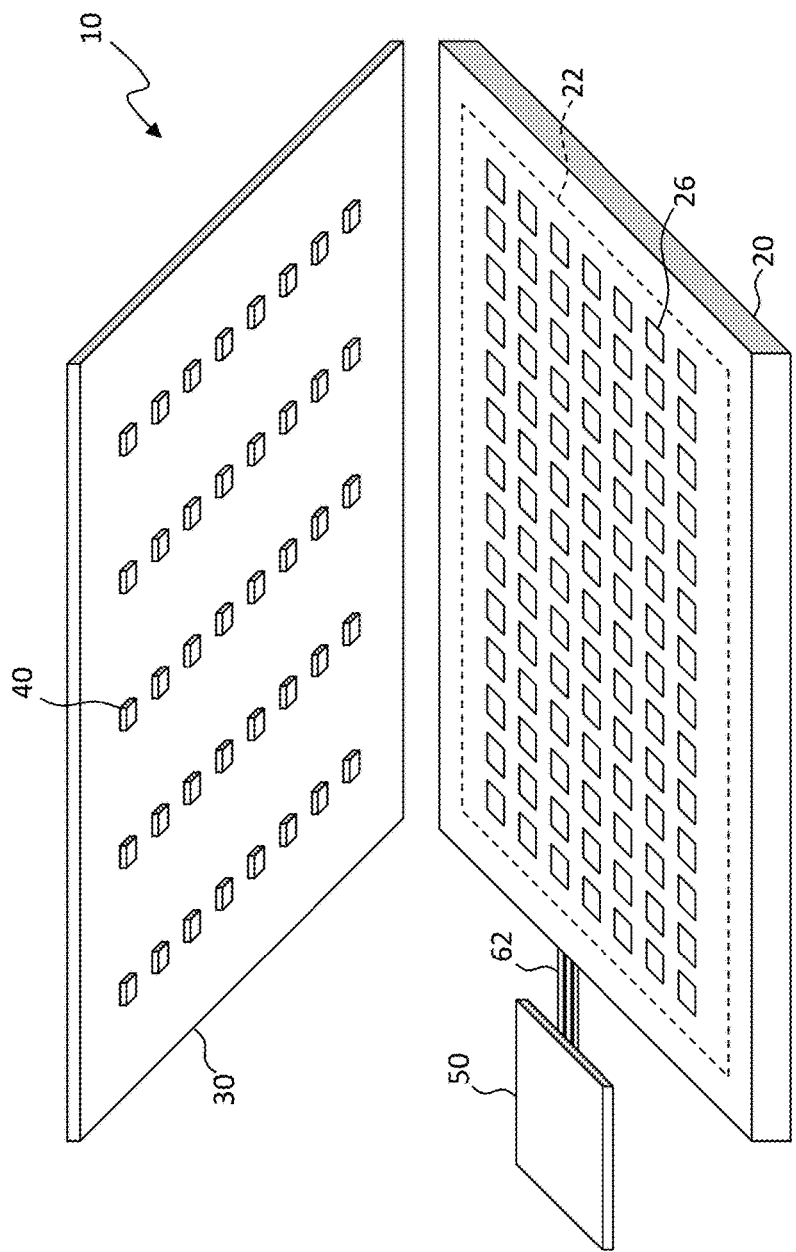
FIG. 1 is an exploded perspective of an embodiment of the present invention.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF THE INVENTION

Figure 2:
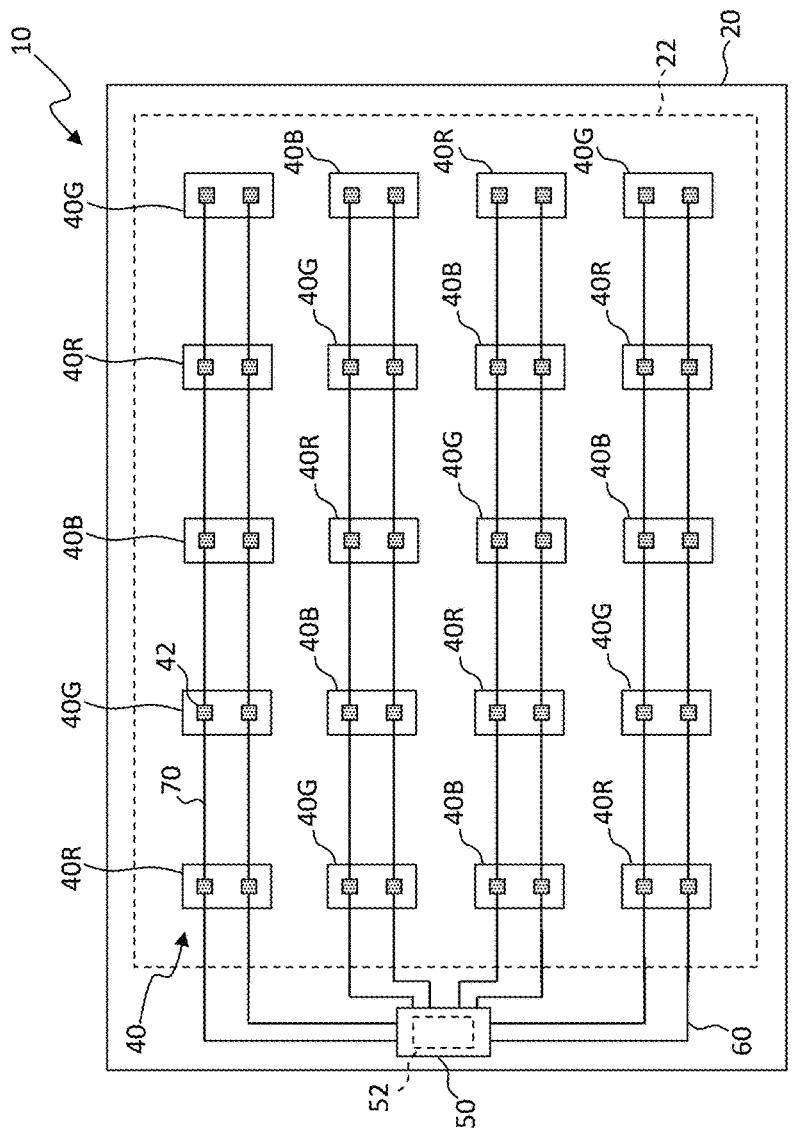
FIG. 2 is a schematic of an embodiment of the present invention.

Referring to the exploded perspective of FIG. 1 and the schematic of FIG. 2, in an embodiment of the present invention a reflective display 10 includes an array of reflective pixels 26 having a display viewing area 22 for viewing electronically displayed information. A layer 30 is located on or over the display viewing area 22 through which the array of reflective pixels 26 is viewed. The array of reflective pixels 26 can be formed on a display substrate 20, for example including glass or plastic. A plurality of micro-LEDs 40 is positioned on or in the layer 30 within the display viewing area 22 and arranged to emit light toward the display viewing area 22. Positioned within the display viewing area 22 means that the plurality of micro-LEDs 40 is within the x-y boundaries of the reflective display viewing area 22 where x and y are orthogonal dimensions parallel to a surface of the reflective display viewing area 22 and largely orthogonal to a viewing direction of the reflective display 10. The micro-LEDs are distributed over the reflective display viewing area 22, are oriented to emit light toward the reflective display viewing area 22, and can be arranged regularly, for example in an array, or irregularly over the display viewing area 22. A plurality of conductors 70 (FIG. 2) is positioned on or in the layer 30 and electrically connected to the micro-LEDs 40, for example through contact pads 42 on the micro-LEDs 40. A controller 50 is connected to the conductors 70 for example through wires 60 forming a bus 62 to control the micro-LEDs 40 to emit light illuminating the display viewing area 22, for example when ambient light is insufficient for viewing the electronically display information. Typically, the micro-LEDs 40 have an emitting face through which light is intended to be emitted. According to the present invention, the emitting face is oriented toward the display viewing area 22. The layer 30 can comprise the controller 50 or the controller 50 can be in or on the layer 30.

According to various embodiments of the present invention, the reflective display 10 of the present invention can include a reflective liquid crystal display, a transflective liquid crystal display, a cholesteric liquid crystal display, an electrophoretic display, an e-paper display, an electronic ink display, an electrowetting display, an electrochromic display, an electrofluidic display, a bistable display, or an interferometric modulator display. As intended herein, a reflective display 10 is a display that relies, at least in part in some circumstances, on ambient illumination incident on the display viewing area 22 to make displayed information in the display viewing area 22 of the reflective display 10 viewable by a viewer. The display viewing area 22 of the reflective display 10 is any portion of the reflective display 10 that displays at least part of an image.

A layer 30 can be any substrate or coating on or in which conductors 70 can be formed and on or in which the micro-LEDs 40 are disposed or formed, for example glass or polymer. The layer 30 can be separate from the display viewing area 22 or reflective pixels 26 and laminated or otherwise adhered to a surface of the display viewing area 22. The layer 30 can be a display cover or display substrate.

In an embodiment, the micro-LEDs 40 are inorganic light-emitting diodes and the conductors 70 are patterned traces of transparent metal oxides such as indium tin oxide (ITO) or aluminum zinc oxide (AZO). Alternatively, the conductors 70 are formed from a micro-wire or a metal mesh of micro-wires. The micro-wires and micro-LEDs 40 are too small to be readily observed or resolved by a viewer at a designed viewing distance and are sufficiently spaced apart that the metal mesh or layer of micro-LEDs 40 appears largely transparent, for example more than 80%, 90%, 95%, or 99% transparent. By referring to an LED as a micro-LED 40 it is meant that the micro-LED is too small to be observed or resolved by a viewer at the designed viewing distance. The conductors 70 can include only one micro-wire each or can include a plurality of micro-wires, for example micro-wires formed in electrically connected diamond-shaped patterns.

The controller 50 can be an integrated circuit and can be connected to the micro-LEDs 40 or reflective pixels 26 through, for example wires 60 arranged in a bus 62 and can be located external to the display viewing area 22 (FIG. 1). Alternatively, as shown in FIG. 2, the controller 50 can be located on a display substrate or display cover outside of the display viewing area 22.

In an embodiment of the present invention, one or more of the micro-LEDs 40 emits white light. In another embodiment of the present invention and as shown in FIG. 2, the plurality of micro-LEDs 40 includes red micro-LEDs 40R that emit red light, green micro-LEDs 40G that emit green light, and blue micro-LEDs 40B that emit blue light (collectively micro-LEDs 40). The red, green, and blue micro-LEDs 40R, 40G, 40B can be arranged in any of a variety of ways, for example in rows as shown in FIG. 2 with each red micro-LED 40R between a green micro-LED 40G and a blue micro-LED 40B in a common row (except at the row edges). As is also shown in FIG. 2, different colors of the micro-LEDs 40 in adjacent rows are spatially offset, so that, for example, a red micro-LED 40R is below a blue micro-LED 40B and above a green micro-LED 40G in a column. In another embodiment (not shown), the rows of micro-LEDs 40 are spatially offset to form a zig-zag column. By spatially offsetting the micro-LEDs 40 or alternating colors in a row or column, a viewer more readily perceives a white color and less readily perceives individual colors emitted from the micro-LEDs 40, improving the viewing experience and displayed color planes.

In an embodiment, a sufficient number of micro-LEDs 40 are arranged at a sufficient distance from the display viewing area 22 to provide a uniform illumination over the display viewing area 22, for example a uniform white-light illumination. In an alternative embodiment of the present invention, the controller 50 controls individual micro-LEDs 40, rows of micro-LEDs 40, or groups of micro-LEDs 40 responsive to an image displayed on the display viewing area 22, for example by a display controller (not shown). In this embodiment, the display controller controls images displayed on the display viewing area 22 and in combination a control circuit 52 in the controller 50 controls the micro-LEDs 40 to emit light only in areas of the image where the image is intended to reflect light and not to emit light in black areas of the image. Thus, local, row, or column dimming can be provided with the front light of the present invention, thereby improving the contrast of the reflective pixels 26. In addition, when separate red, green and blue micro LEDs are used, their relative brightness may be used to control the white point and color temperature of the reflective display.

In typical projected capacitive touch panels, the electrodes are formed at, for example, a 4 mm pitch. Light emission from micro-LEDs 40 is dependent on the optical structure of the micro-LED 40 and the distance from the emitting micro-LEDs 40 to the illuminated surface (i.e., a surface of the display viewing area 22) affects the light uniformity on the illuminated surface. Since in some embodiments a very thin reflective display 10 and apparently white light illumination from the front light are desirable, in another embodiment, the red, green, and blue micro-LEDs 40 are located in groups of one red, one green, and one blue micro-LED 40R, 40G, 40B. the micro-LEDs 40 in each group are located in close proximity and the groups are separated by a greater distance than the micro-LEDs 40 within each group. This arrangement enables the different colors emitted by each color micro-LED 40 to provide a visually white light.

Figure 3:
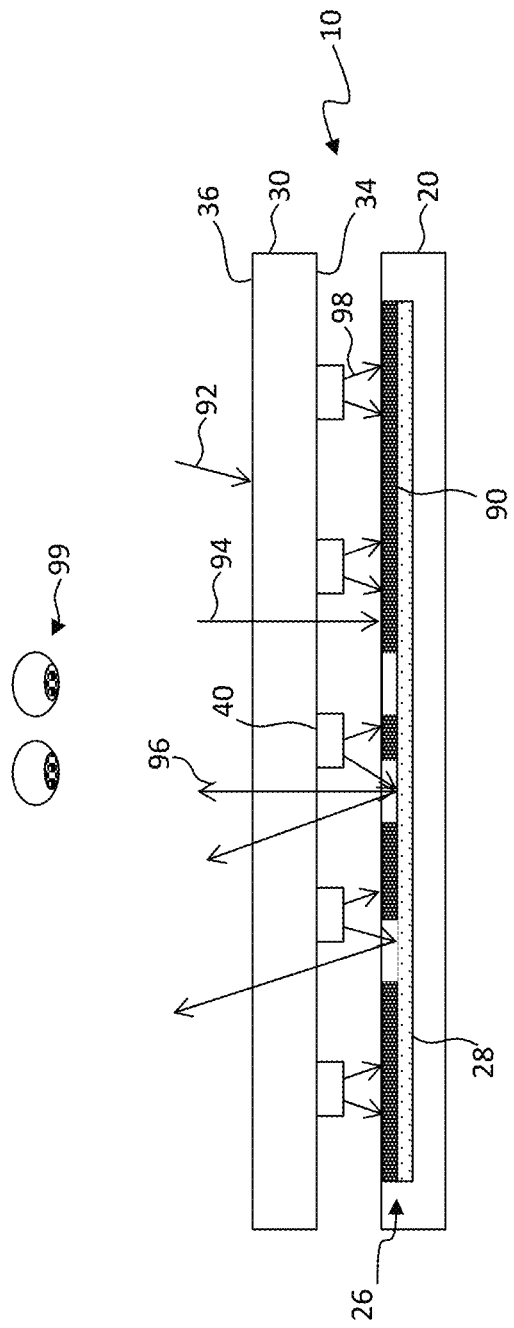

Referring next to FIGS. 3-7, the micro-LEDs 40 and layer 30 are arranged in a variety of ways in a corresponding variety of embodiments. As shown in FIG. 3, the micro-LEDs 40 of the reflective display 10 are located on the layer 30 between the layer 30 and a surface of the display viewing area 22 and an air gap can be located between the emitting face of the micro-LEDs 40 and a surface of the display viewing area 22. The micro-LEDs 40 can have a thickness less than 50, 20, 10, or 5 microns. If the air gap (or a compliant layer) is already in place, locating the micro-LEDs 40 in the air gap (or compliant layer) will not increase the thickness of the device if the gap is thicker than the micro-LEDs 40. Alternatively, if the micro-LEDs 40 are located, for example on the inside of a display cover, the additional thickness of the micro-LED 40 can be limited to the thickness of the micro-LEDs 40. The gap can be a thickness of the layer 30 or a portion of the layer 30 thickness. This arrangement can avoid trapping light 98 emitted by the micro-LEDs 40. Alternatively, the micro-LEDs 40 are in contact with a surface of the display viewing area 22 (FIG. 4) and can include an optically clear adhesive 32 formed in a layer to adhere the micro-LEDs 40 and layer 30 to a surface of the display viewing area 22 to form a more mechanically robust, solid-state structure (FIG. 5). Preferably, the optically clear adhesive is index matched to the display layer or micro-LEDs, or both, so as to prevent contrast-reducing reflections. The micro-LEDs 40 in these configurations can be top emitting, that is they emit light in a direction away from the substrate (layer 30) to which the micro-LEDs 40 are affixed or on which they are constructed. As shown in FIG. 6, the layer 30 can be between the micro-LEDs 40 and the reflective display 10. The layer 30 can be in contact with a surface of the display viewing area 22 or adhered to it, as shown, or can be separated by an air gap from a surface of the display viewing area 22 (not shown). The layer 30 can be a display cover or display substrate. In an alternative embodiment, a surface of the display viewing area 22 is or forms the layer 30 (FIG. 7) and the micro-LEDs 40 are disposed directly on a surface of the display viewing area 22. A protective layer 38 can be coated over the micro-LEDs 40, as shown in FIGS. 6 and 7. The micro-LEDs 40 in these configurations can be bottom emitting, that is they emit light through the substrate (layer 30) to which the micro-LEDs 40 are affixed or on which they are constructed.

In all of these embodiments, referring back to FIG. 3, a layer of reflective pixels 26 forms an image 90 under the control of a display controller (not shown). The display controller can be the controller 50. When incident ambient light 92 is available, dark reflective pixels 26 absorb the ambient light 94 and clear, transparent, or colored reflective pixels 26 reflect ambient light 96 from a reflector 28, such as a metallic reflective layer. When incident ambient light 92 is not available, the micro-LEDs 40 emit light 98. The reflective pixels 26 respond to the emitted light 98 as they do to incident ambient light 92, absorbing it where the reflective pixels 26 are dark and reflecting it where the reflective pixels 26 are light. In any case, a viewer 99 perceives only the reflected light, whether from ambient illumination or emitted from the micro-LEDs 40. Preferably, the reflector 28 is located very close to the reflective pixels 26 to avoid parallax, as shown.

In embodiments of the present invention, the front light is integrated with a touch screen without adding additional light-absorbing layers so that the reflective display 10 includes a touch sensor. As shown, for example in FIG. 3, the layer 30 has a first side 34 adjacent to a surface of the display viewing area 22 and a second side 36 opposite the reflective display 12. In various embodiments, a pattern of electrodes 80 is formed on the first side 34, on the second side 36, or on both the first side 34 and the second side 36.

Figure 8:
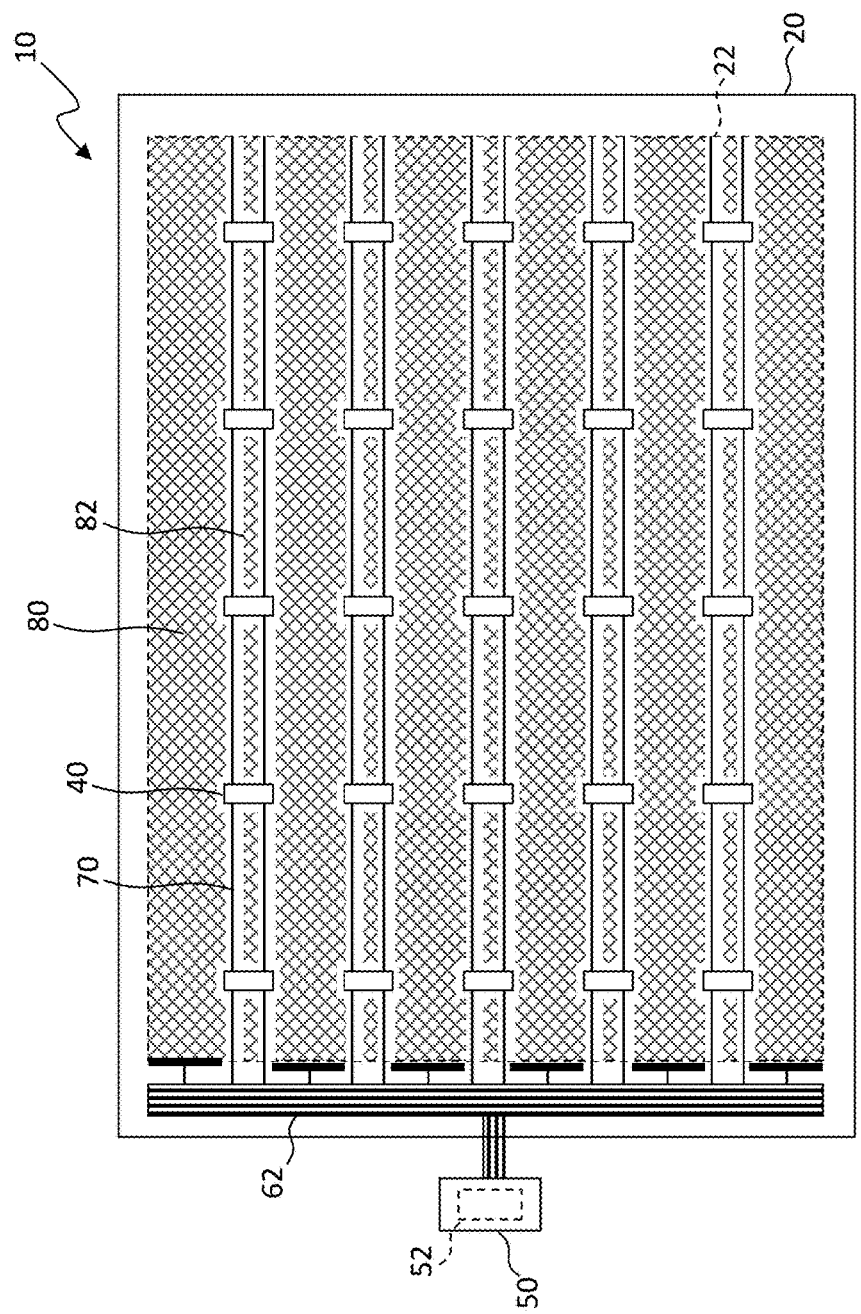
FIGS. 8 and 9 are schematics of embodiments of the present invention including a touch screen electrically separate from the front light.

Referring to the schematic of FIG. 8, in an embodiment of the reflective display 10 of the present invention, the conductors 70 and electrodes 80 are formed on a common side of the layer 30 (FIG. 1) over the display viewing area 22, for example in a direction toward a viewer of the reflective display 10. The common side can be the first side 34 (corresponding to the cross sections of any of FIGS. 3-5 or the second side 36 (corresponding to FIG. 6). As shown in FIG. 8, the electrodes 80 are formed in an array of parallel electrodes 80 that are electrically separate and insulated from the conductors 70. In this embodiment, the conductors 70 and the micro-LEDs 40 are disposed between the electrodes 80 and can serve to visually fill in the space between the electrodes 80 providing a uniform appearance to the display viewing area 22. Electrically separate micro-wires or metal oxide conductors can be added to serve as a dummy electrode 82 to further provide optical uniformity to the display viewing area 22. The micro-LEDs 40 are shown connected in parallel; in another embodiment the micro-LEDs 40 are connected serially to reduce the wiring width across the display viewing area 22.

Although not shown in FIG. 8, a capacitive touch screen can be formed with an electrically separate second array of electrodes 84 on the opposite side of the layer 30 and extending in a direction different from the direction in which the electrodes 80 extend. Alternatively, the separate second array of electrodes 84 are on the same side as the first electrodes 80, for example using jumpers 86 (e.g., which can be micro-transfer printed) to avoid electrical shorts between the arrays of first and second electrodes 80, 84 wherein the first and second electrodes 80, 84 cross. Examples of jumpers that can be used herein are disclosed in U.S. patent application Ser. No. 14/743,788, filed Jun. 18, 2015 and titled "Micro Assembled LED Displays and Lighting Elements." The orthogonal arrays of first and second electrodes 80, 84 can form a projected mutual-capacitive touch sensor. Alternatively, referring to FIG. 9, the arrays of first and second electrodes 80, 84 can form alternating diamond shapes in a common layer with jumpers 86 over electrical connections between the diamonds in one layer. In yet another embodiment, electrodes 80 form a self-capacitance touch screen. In any of these embodiments, the conductors 70 and micro-LEDs 40 are located between the electrically separate electrodes 80. If an array of electrodes is located on a touch side of the layer 30, a protective layer or cover can be disposed over the array of electrodes to protect them from the environment or touching implements such as fingers.

The controller 50 includes a control circuit 52 that provides electrical power to the conductors 70 and to the micro-LEDs 40 to emit light from the LEDs 40. Separately the control circuit 52 can provide signals to the electrodes 80 to detect touches on or near the layer 30 or a surface of the display viewing area 22. By sequentially energizing the electrodes 80 and sensing the capacitance of each of the second electrodes (e.g., electrodes 84 in FIG. 9), touches can be detected.

Figure 9:
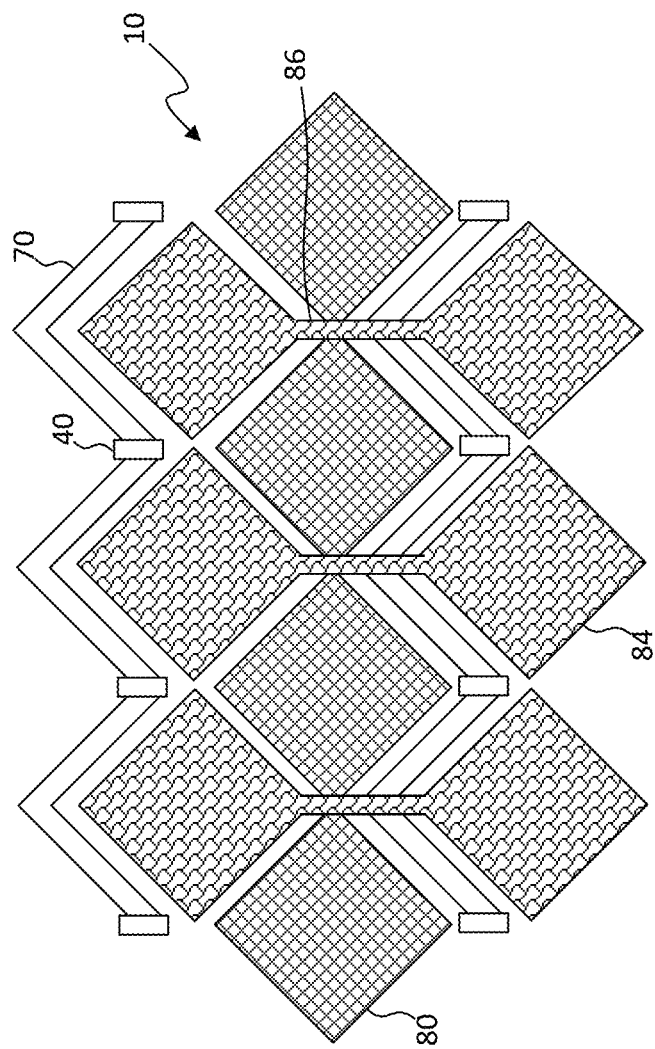
Figure 10:
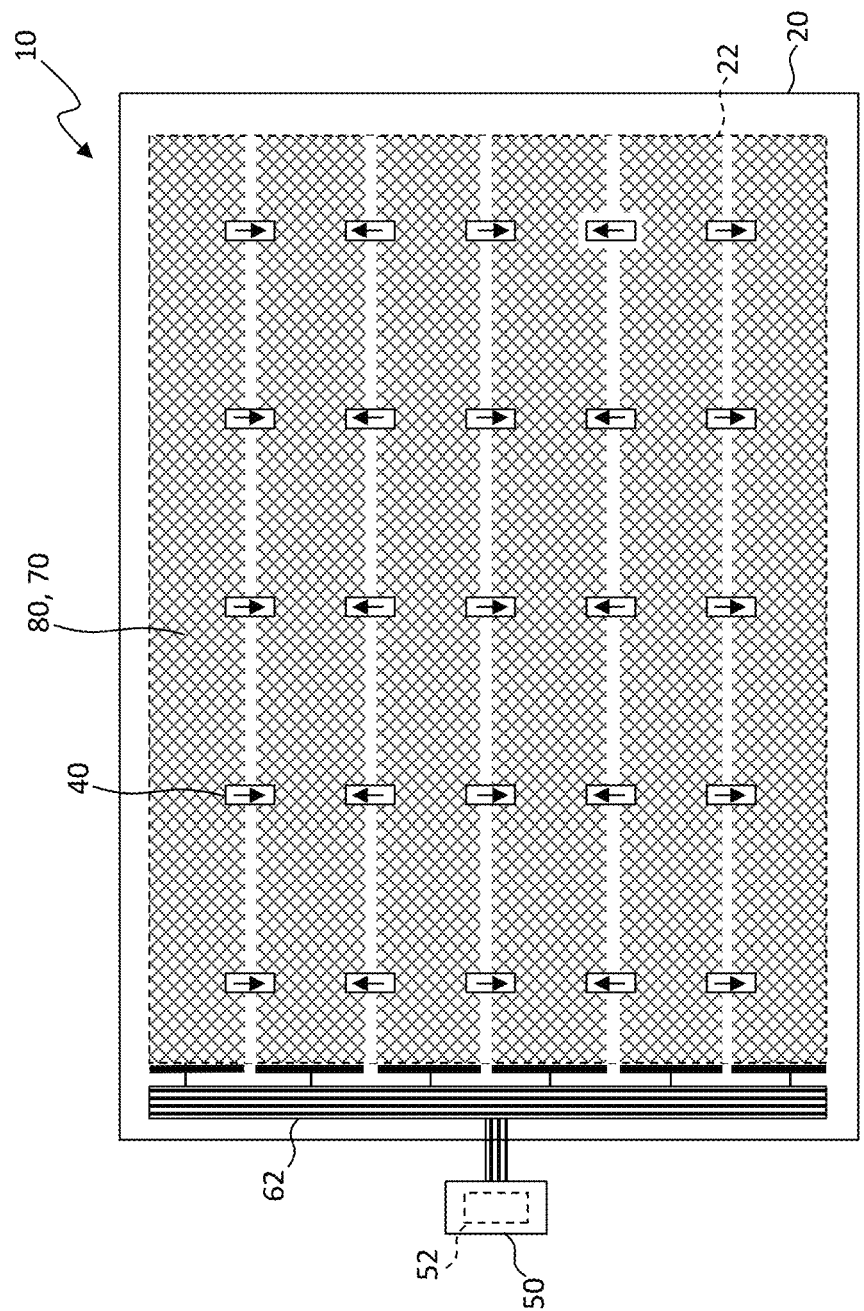
FIGS. 10-12 are schematics of other embodiments of the present invention including a touch screen electrically connected to the front light.

In the embodiments of FIGS. 8 and 9, the conductors 70 and micro-LEDs 40 are electrically separate from the electrodes 80. In an alternative embodiment, the conductors 70 are the electrodes 80 so that the same micro-wires or conductive material is used to drive the micro-LEDs 40 and to form a touch screen. Referring to FIG. 10, the micro-LEDs 40 are electrically connected to adjacent first electrodes 80 (that are also the conductors 70). As shown in FIG. 10, the rows of micro-LEDs 40 can be configured in alternating orientations, as indicated with arrows, so that if every other electrode 80 is held to ground and a voltage placed on the remaining electrode 80, forward-biased micro-LEDs 40 will experience a voltage difference, current can flow through the micro-LEDs 40 and the micro-LEDs 40 emit light. If the micro-LEDs are reverse biased, no current will flow. Alternatively, if the electrodes 80 are sequentially energized to detect touches, if the micro-LEDs 40 are reverse biased with respect to the energized electrode 80, no current flows through the micro-LEDs 40 and touches can be sensed as if the micro-LEDs 40 were not present. Alternatively, if the micro-LEDs 40 are forward biased with respect to the energized electrode 80 (as will happen with every other electrode 80), current could flow through the micro-LEDs 40 (depending on the driving signal) and touches could be sensed across three electrodes 80 (the energized electrode 80 and the neighboring electrodes 80 on either side of the energized electrode 80 connected to the energized electrode 80 by the micro-LEDs 40). The non-energized electrode 80 can be tri-stated or connected to a high impedance to reduce current flow to neighboring electrodes 80. By comparing any touches with touches detected using the neighboring electrodes 80, a touch signal for the energized electrode 80 can be isolated. Thus, the structure of FIG. 10 can be used in a first mode and in a first time period to emit light from the micro-LEDs 40 by providing a voltage bias on alternating electrodes 80 and can be used in a second mode at a second time period different from the first time period to detect touches by sequentially providing a drive signal on each electrode 80 of an array of electrodes 80 and sensing the capacitance on the second electrodes 84.

Figure 11:
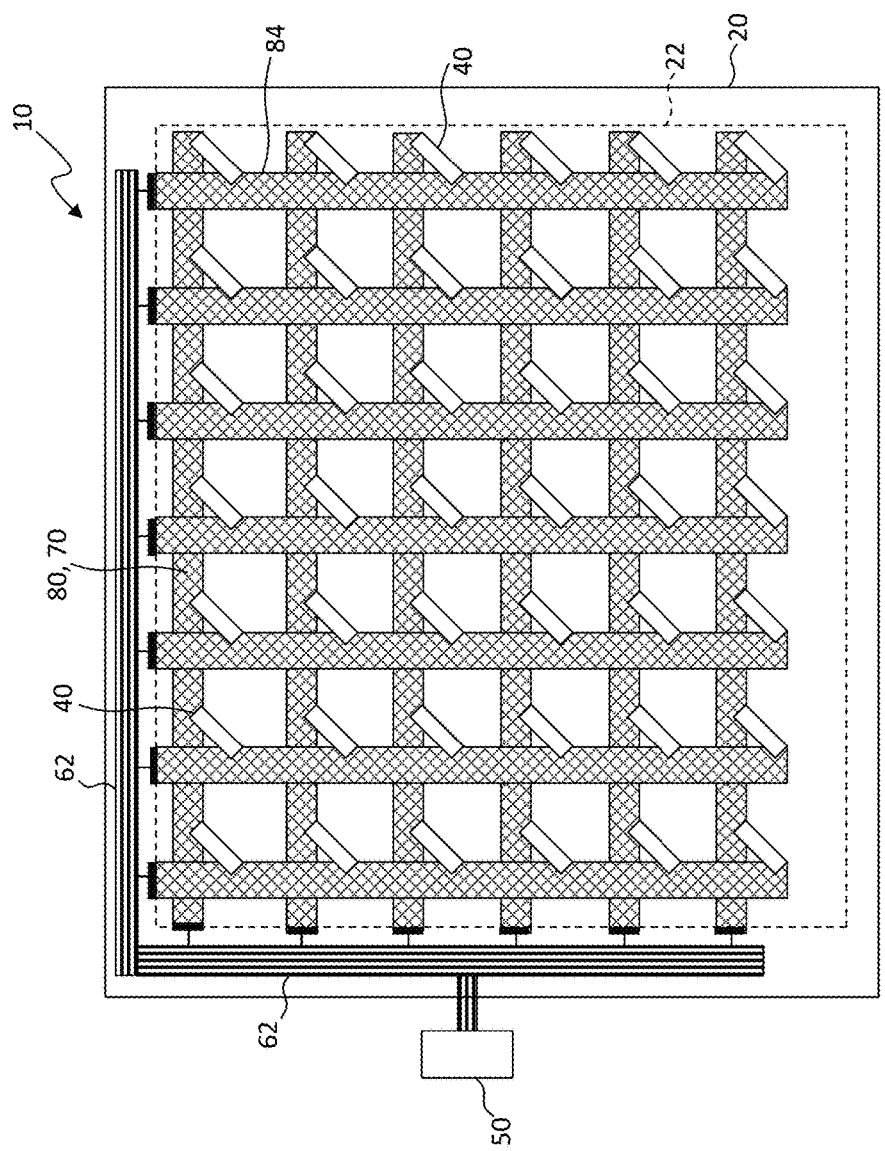
Figure 12:
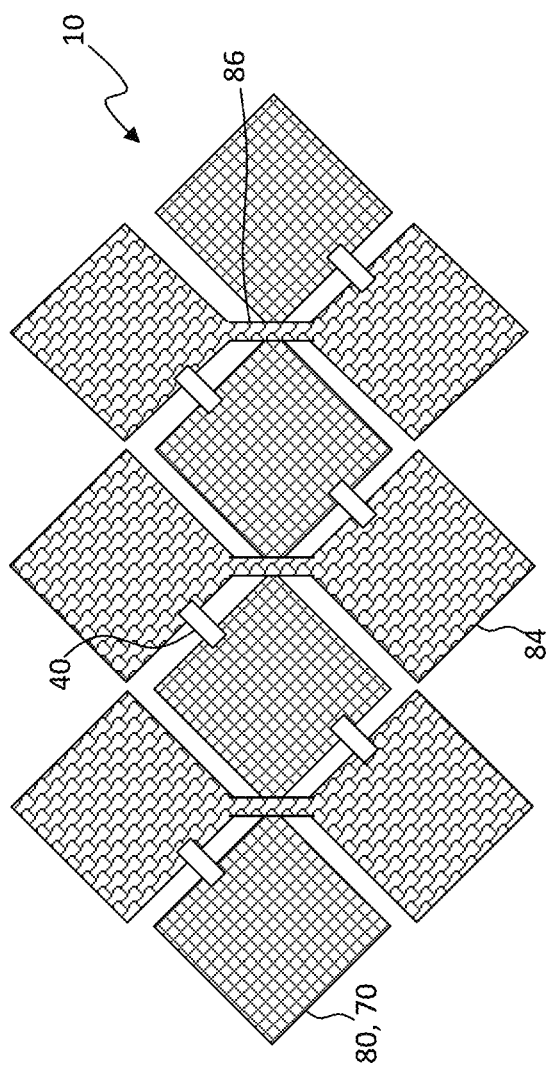

Referring to both FIGS. 11 and 12, in an embodiment of the present invention, an array of electrically separate first electrodes 80 extend in a first direction and an array of electrically separate second electrodes 84 extending in a second direction different from the first direction, for example orthogonally. Where the first and second electrodes 80, 84 cross, jumpers 86 are provided to prevent electrical shorts between the first and second electrodes 80, 84 (not shown in FIG. 11). Each micro-LED 40 is connected to a first electrode 80 and a second electrode 84. In a first mode and during a first time period, the first and second electrodes 80, 84 are forward biased so that current flows through the micro-LEDs 40, light is emitted, and the micro-LEDs 40 act as a front light. In a second mode and during a second time period different from the first time period, the first electrodes 80 are sequentially driven and the second electrodes 84 are sensed to detect a touch. The drive signal is selected so that the micro-LEDs 40 are reverse biased and no current flows through the micro-LEDs 40 and no light is emitted. Alternatively, the micro-LEDs 40 are forward biased and the drive signal also causes the micro-LEDs 40 to emit light.

According to the present invention, the use of touch controller chiplets 44 enables touch sensing in higher resolution or larger displays.

In a further embodiment of the present invention, the controller 50 includes a control circuit 52 that controls the micro-LEDs 40 in response to ambient illumination, for example using a light sensor so that the micro-LEDs 40 are controlled to emit light when little or no ambient illumination is present. The light emitted from the micro-LEDs 40 can be inversely proportional to the ambient illumination.

Figure 13:
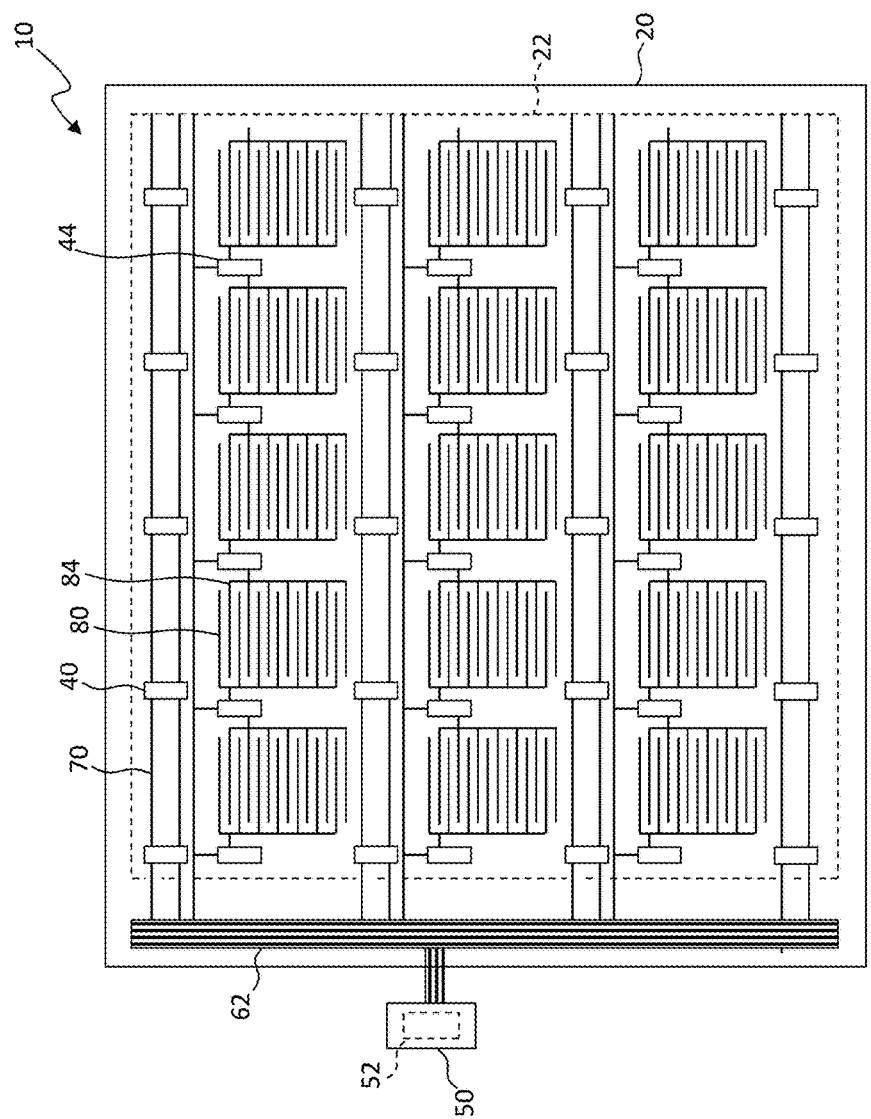
FIG. 13 is a schematic of embodiments of the present invention including local touch screen sensors electrically separate from the front light.

Referring to FIG. 13 in another embodiment of the present invention, an array of touch controller chiplets 44 are distributed over the display viewing area 22. Each touch controller chiplet 44 is electrically connected to one or more electrically separate first and second electrodes 80, 84 to detect touches on or adjacent to the one or more first and second electrodes 80, 84, for example on a display screen of the reflective display 10. The touch controller chiplets 44 are electrically connected to the controller 50 through conductors 70 that can be electrically separate from the conductors 70 that are electrically connected to the micro-LEDs 40. The conductors 70 can include multiple micro-wires or electrical connections, such as a bus. Other electrode arrangements are illustrated in commonly assigned U.S. patent application Ser. No. 14/795,831 filed Jul. 9, 2015, entitled Active-Matrix Touchscreen and can be used to implement a reflective display 10 of the present invention. In an embodiment, a conductor 70 passes through a micro-LED 40 or touch controller chiplet 44 to facilitate routing conductors 70 or electrodes 80. The touch controller chiplet 44 can be a chiplet, for example a small unpackaged integrated circuit such as a bare die. The controller 50 can separately control the micro-LEDs 40 and the touch controller chiplets 44.

Figure 14:
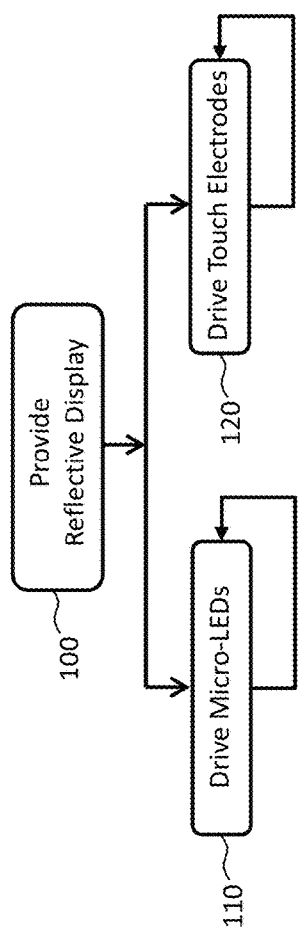
FIGS. 14 and 15 are flow diagrams illustrating different methods of operating the present invention.
Figure 15:
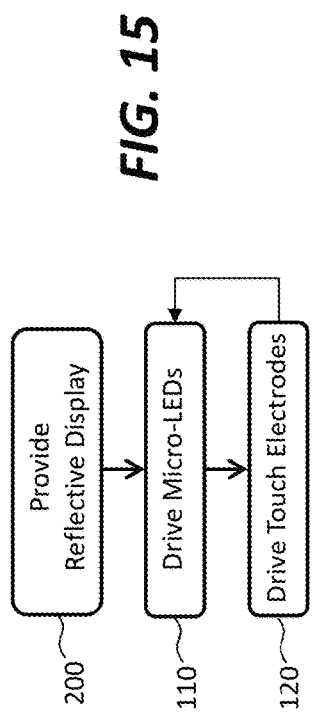

Referring to FIGS. 14 and 15, various embodiments of the reflective display 10 of the present invention can be operated in different ways. As shown in FIG. 14, a reflective display 10 is provided in step 100 that includes arrays of electrodes (e.g. first and second electrodes 80, 84) electrically separate from each other and from the conductors 70. The controller 50 controls the micro-LEDs 40 to emit light in step 110 and, at the same time, also controls the arrays of first and second electrodes 80, 84 to detect a touch in step 120. Such an embodiment is implemented using the arrangements illustrated in FIGS. 8, 9, and 13. Alternatively, as shown in FIG. 15, a reflective display 10 is provided in step 200 that includes arrays of first and second electrodes 80, 84 that are electrically connected to the conductors 70. The controller 50 controls the micro-LEDs 40 to emit light in step 110 during a first time period and subsequently at a second different time period controls the arrays of first and second electrodes 80, 84 to detect a touch in step 120. Such an embodiment is implemented using the arrangements illustrated in FIGS. 10, 11, and 12.

The present invention can be constructed using integrated circuit and printed circuit board methods, materials, and processes. The micro-LEDs 40 and touch controller chiplets 44 can be made using semiconductor materials, integrated circuit materials and processes, and micro transfer materials and printing processes. Conductors 70 and micro-wires useful for first and second electrodes 80, 84 can be made using photolithographic processes with metal or metal oxides, or using metal mesh technologies including conductive inks, imprinting, printing, electroplating, or inkjet deposition. Controllers 50 can be made in an integrated circuit and connected to the reflective pixels 26 or micro-LEDS 40 using ribbon cables, flex connectors, and the like or controllers 50 can be located on a display substrate or cover. Display substrates and covers are available. The micro-LEDs 40 and touch controller chiplets 44 can be disposed on the layer 30 using printing methods such as micro transfer printing.

In various embodiments of the present invention, the micro-LEDs 40 are formed in a semiconductor substrate using integrated circuit processes. Each micro-LED 40 can have an area or a light-emissive area of less than 500, 250, 100, or 50 square microns. The micro-LEDs 40 can be spaced apart in one or two dimensions by 50 microns or more, 100 microns or more, 500 microns or more, 1 mm or more, 2 mm or more, or 5 mm or more in each dimension over the display viewing area 22. Because micro-LEDs 40 have a relatively small emissive area compared to the display viewing area 22, the fill factor for the reflective display 10 can be very low, for example the area of the micro-LEDs 40 over the display viewing area 22 is less than or equal to one-quarter, one eighth, one tenth, one twentieth, one fiftieth, one hundredth, one five-hundredth, one thousandth, one two-thousandth, or one ten-thousandth of the display viewing area 22 itself. The display can have a small aperture ratio and, in certain embodiments, include additional electrical components in the display viewing area 22 as described in U.S. patent application Ser. No. 14/754,573 filed Jun. 29, 2015, entitled Small-Aperture-Ratio Display with Electrical Component.

In certain embodiments, the reflective display 10 includes 10,000 or more touch controller chiplets 44, 50,000 or more touch controller chiplets 44, 100,000 or more touch controller chiplets 44, 500,000 or more touch controller chiplets 44, or 1,000,000 or more touch controller chiplets 44. The touch controller chiplets 44 can be interspersed between the micro-LEDs 40 in a row or between rows of micro-LEDs 40, as in FIG. 13. In another embodiment (not shown), the touch controller chiplets 44 are electrically connected to the micro-LEDs 40, for example to provide power, ground, or control signals.

The micro-LEDs 40 can have a variety of different sizes or emissive areas. For example, the micro-LEDs 40 can have a width from 2 to 5 μm, 5 to 10 μm, 10 to 20 μm, or 20 to 50 μm, a length from 2 to 5 μm, 5 to 10 μm, 10 to 20 μm, or 20 to 50 μm, or a height from 2 to 5 μm, 4 to 10 μm, 10 to 20 μm, or 20 to 50 μm.

In an embodiment, the touch controller chiplets 44 are connected, for example at least to one neighboring touch controller chiplets 44 in either or both a row direction or a column direction. The touch controller chiplets 44 can be connected in a daisy chain, in rows and columns, in rectangular subsets, or connected in common to a bus 62 (as shown). The touch controller chiplets 44 can communicate with each other or through each other and can communicate with the controller 50. In an embodiment, each touch controller chiplet 44 can independently and simultaneously detect a touch and transmit a touch signal to the controller 50 in response to the detected touch. Although the transmission of a touch signal from a touch controller chiplet 44 to the controller 50 can include communicating the touch signal to or through other touch controller chiplets 44 to which the touch controller chiplet 44 is connected, such transmission does not imply that the touch controller chiplets 44 are not independent. The touch controller chiplets 44 operate independently because they can independently energize the first electrodes 80 and receive sensor signals from the second electrodes 84 (or vice versa).

In various embodiments of the present invention, the touch controller chiplet 44 controls a capacitive touch sensor, an optical touch sensor, an acoustic touch sensor, an inductive touch sensor, a piezo-electric sensor, or a resistive touch sensor. In an embodiment, the touch controller chiplet 44 controls a capacitive touch sensor and includes one or more capacitors, each of which is connected to the touch controller chiplet 44. In one embodiment of the present invention, the touch controller chiplet 44 controls a self-capacitive touch sensor. In another embodiment, the touch controller chiplet 44 controls a mutual-capacitive touch sensor having at least two electrical conductors that can be interdigitated as shown in FIG. 13 with first and second electrodes 80, 84 both electrically connected to a common touch controller chiplet 44 or to different touch controller chiplets 44, as shown.

Elements of the present invention can be constructed in a variety of ways. In a first way, the micro-LEDs 40 and touch controller chiplets 44 are formed in or on a source substrate (for example a semiconductor substrate) using photolithographic methods and then disposed using micro transfer printing onto one or more substrates, for example layer 30 or a surface of the display viewing area 22. The layer 30 or surface of the display viewing area 22 can be glass, plastic, or metal. The source wafer can be a crystalline semiconductor substrate having a much higher circuit performance than thin-film semiconductor layers formed on a glass, plastic or metal backplane substrate. Any of the touch controller chiplet 44 and the micro-LEDs 40 are formed in separate semiconductor substrates that are then individually located and interconnected on the layer 30, for example with photolithographically deposited and patterned metal traces.

The layer 30 can consist of or include one or more of a polymer, plastic, resin, polyimide, PEN, PET, metal, metal foil, glass, a semiconductor, or sapphire. The layer 30 can have a transparency greater than or equal to 50%, 80%, 90%, or 95% for visible light. The layer 30 can have a thickness from 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm.

The reflective display 10 can be formed using micro-transfer techniques. Additional details useful in understanding and performing aspects of the present invention are described in U.S. patent application Ser. No. 14/743,788, filed Jun. 18, 2015 and titled Micro Assembled LED Displays and Lighting Elements. In an additional embodiment, a multi-step transfer or assembly process is used. By employing such a multi-step transfer or assembly process, increased yields are achieved and thus reduced costs for the active-matrix touchscreen 5 of the present invention. A discussion of compound micro-assembly structures and methods is provided in U.S. patent application Ser. No.

14/822,868 filed Aug. 10, 2015, entitled Compound Micro-Assembly Strategies and Devices.

In certain embodiments, touch controller chiplets 44 are disposed exclusively on the layer 30. Thus, in an embodiment, the touch controller chiplets 44 are in or on a common plane with the micro-LEDs 40 and additional layers are not needed for the touchscreen.

In operation, external power and ground signals (not shown) are provided to the array of touch controller chiplets 44. Each touch controller chiplet 44 repeatedly and independently provides drive signals to a corresponding first electrode 80 and receives or detects sense signals from the second electrode 84 (or vice versa) in response that indicate a touch or no-touch. The sense signals are analyzed and then compared to stored sense signals to detect changes indicative of a touch, for example changes in an electrical sense signal representing capacitance or ambient light. If a meaningful change is communicated to the controller 50.

As is understood by those skilled in the art, the terms "over", "under", "above", "below", "beneath", and "on" are relative terms and can be interchanged in reference to different orientations of the layers, elements, and substrates included in the present invention. For example, a first layer on a second layer, in some embodiments means a first layer directly on and in contact with a second layer. In other embodiments, a first layer on a second layer can include another layer there between.

Having described certain embodiments, it will now become apparent to one of skill in the art that other embodiments incorporating the concepts of the disclosure may be used. Therefore, the invention should not be limited to the described embodiments, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The invention has been described in detail with particular reference to certain embodiments thereof, but it will be understood that variations and modifications can be effected within the spirit and scope of the invention.

PARTS LIST 10 reflective display
20 display substrate
22 display viewing area
26 reflective pixels
28 reflector
30 layer
32 optically clear adhesive
34 first side
36 second side
38 protective layer
40 micro-LED
40R red micro-LED
40G green micro-LED
40B blue micro-LED
42 contact pad
44 touch controller chiplet
50 controller
52 control circuit
60 wires
62 bus
70 conductor
80 electrode/first electrode
82 dummy electrode
84 second electrode
86 jumper
90 image
92 incident ambient light
94 absorbed ambient light
96 reflected ambient light
98 emitted micro-LED light
99 viewer
100 provide reflective display step
110 control micro-LEDs to emit light and control electrodes to detect a touch step
120 control micro-LEDs to emit light step
130 control electrodes to detect a touch step
200 provide reflective display structure step

What is claimed:

1. A reflective display, comprising:
an array of reflective pixels in or beneath a reflective display viewing area for electronically displaying information to be viewed, wherein each reflective pixel in the array of reflective pixels is a reflective element that controllably absorbs or reflects light and the array of reflective pixels is operable to form an image under control of a display controller;
a layer located on or over the reflective display viewing area, the layer comprising:
a plurality of micro-LEDs positioned in or on the layer within the x-y boundaries of the reflective display viewing area and oriented to emit light toward the reflective display viewing area; and
a plurality of conductors positioned on or in the layer and electrically connected to the plurality of micro-LEDs; and
a controller connected to the plurality of conductors to control the plurality of micro-LEDs to emit light illuminating the reflective display viewing area.

2. The reflective display of claim 1, wherein the layer is a display cover or substrate.

3. The reflective display of claim 1, wherein the plurality of micro-LEDs have an emitting face and are positioned on or in the layer such that there is a gap between the emitting face of the plurality of micro-LEDs and the surface of the reflective display viewing area.

4. The reflective display of claim 1, wherein the micro-LEDs in the plurality of micro-LEDs are inorganic micro-LEDs.

5. The reflective display of claim 1, wherein one or more of the plurality of micro-LEDs emits white light.

6. The reflective display of claim 1, wherein the plurality of micro-LEDs comprises red micro-LEDs that emit red light, green micro-LEDs that emit green light, and blue micro-LEDs that emit blue light.

7. The reflective display of claim 6, wherein the red micro-LEDs are located adjacent to green micro-LEDs, adjacent to blue micro-LEDs, or adjacent to both green and blue micro-LEDs.

8. The reflective display of claim 6, wherein the plurality of micro-LEDs is disposed in rows comprising red, green, and blue micro-LEDs and the micro-LEDs in adjacent rows are spatially offset or the colors of micro-LEDs in adjacent rows are spatially offset.

9. The reflective display of claim 6, wherein the plurality of micro-LEDs is disposed in two or more groups each comprising one red, one green, and one blue micro-LED and wherein the distance between the micro-LEDs within a group is less than the distance between the groups of micro-LEDs.

10. The reflective display of claim 1, wherein the layer has a first side adjacent to the reflective display viewing area and a second side opposite the first side, and the reflective display comprises a touch sensor comprising a pattern of electrodes formed on the first side, on the second side, or on both the first side and the second side.

11. The reflective display of claim 10, wherein the controller comprises a control circuit that provides electrical power to the plurality of conductors to emit light from the plurality of micro-LEDs and separately provides signals to the electrodes of the pattern of electrodes to detect touches on or near the layer or the reflective display.

12. The reflective display of claim 11, wherein the pattern of electrodes comprises an array of electrodes electrically separate from the plurality of conductors, wherein at least one of (i) the plurality of conductors and (ii) the plurality of micro-LEDs are disposed between the two of the plurality of electrodes.

13. The reflective display of claim 12, wherein the touch sensor comprises a pattern of electrodes on the first side and on the second side and the electrodes pattern of electrodes on the first side forms an array of electrically separate first electrodes extending in a first direction and the electrodes of the pattern of electrodes on the second side forms an array of electrically separate second electrodes extending in a second direction, wherein the second direction is different from the first direction.

14. The reflective display of claim 10, wherein the controller comprises a control circuit that provides electrical power to the plurality of conductors to emit light from the plurality of micro-LEDs during a first time period and provides signals to the pattern of electrodes to detect touches during a second time period different from the first time period.

15. The reflective display of claim 10, wherein the pattern of electrodes comprises the plurality of conductors, the pattern of electrodes are formed in an array of parallel electrodes, and each of the plurality of micro-LEDs is connected to a pair of adjacent electrodes.

16. The reflective display of claim 10, wherein the pattern of electrodes comprises the plurality of conductors, the pattern of electrodes forms an array of electrically separate first electrodes extending in a first direction and an array of electrically separate second electrodes extending in a second direction that is different from the first direction, and each micro-LED is connected to a first electrode and a second electrode.

17. The reflective display of claim 1, comprising an array of touch controller chiplets distributed over the display area each electrically connected to one or more electrically separate electrodes to detect touches on or adjacent to the one or more electrodes.

18. A method of operating a reflective display, comprising:
providing the reflective display, wherein the reflective display comprises:
an array of reflective pixels in or beneath a reflective display viewing area for electronically displaying information to be viewed, wherein each reflective pixel in the array of reflective pixels is a reflective element that controllably absorbs or reflects light and the array of reflective pixels is operable to form an image under control of a display controller;
a layer located on or over the reflective display viewing area, the layer comprising:
a plurality of micro-LEDs positioned in or on the layer within the x-y boundaries of the reflective display viewing area and oriented to emit light toward the reflective display viewing area; and
a plurality of conductors positioned on or in the layer and electrically connected to the plurality of micro-LEDs;
a controller connected to the conductors to control the plurality of micro-LEDs to emit light illuminating the reflective display viewing area; and
an array of electrodes electrically separate from the plurality of conductors;
controlling, by the controller, the plurality of micro-LEDs to emit light and the array of electrodes to detect a touch.

19. The method of claim 18, wherein the controller controls the plurality of micro-LEDs to emit light at the same time as a touch is detected.

20. The method of claim 18, wherein the controller controls the plurality of micro-LEDs to emit light during a first time period and detects a touch with the array of electrodes during a second time period different from the first time period.

21. The reflective display of claim 1, wherein the layer is a transparent layer.

22. The reflective display of claim 21, wherein the transparent layer has a transparency greater than or equal to 50% for visible light.

23. The reflective display of claim 1, comprising the display controller.

24. The reflective display of claim 23, wherein the controller is the display controller.

25. The reflective display of claim 23, wherein the controller comprises a control circuit that controls the micro-LEDs responsive to the image displayed on the reflective display to provide front light dimming.

26. The method of claim 18, wherein the reflective display comprises the display controller.

* * * * *